United States Patent [19]
Onitsuka et al.

[11] Patent Number: 6,023,371
[45] Date of Patent: Feb. 8, 2000

[54] COLOR CONVERSION MATERIAL, AND ORGANIC ELECTROLUMINESCENT COLOR DISPLAY USING THE SAME

[75] Inventors: Osamu Onitsuka; Tetsushi Inoue, both of Chiba; Akira Ebisawa, Ibaraki; Mutsuko Nakano, Tokyo, all of Japan

[73] Assignee: TDK Corporation, Tokyo, Japan

[21] Appl. No.: 09/093,091

[22] Filed: Jun. 8, 1998

[30] Foreign Application Priority Data

Jun. 9, 1997 [JP] Japan ..................................... 9-166627

[51] Int. Cl.⁷ ................................................. G02B 27/10
[52] U.S. Cl. .......................................... 359/620; 250/458.1
[58] Field of Search ............................. 250/458.1, 459.1; 359/620; 313/416, 483

[56] References Cited

U.S. PATENT DOCUMENTS

| | | | |
|---|---|---|---|
| 4,702,574 | 10/1987 | Bawa | 351/162 |
| 4,989,956 | 2/1991 | Wu et al. | 350/345 |
| 5,043,193 | 8/1991 | Ueda | 428/18 |
| 5,227,773 | 7/1993 | Wu et al. | 340/815.07 |
| 5,714,012 | 2/1998 | Murata et al. | 136/247 |
| 5,806,834 | 9/1998 | Yoshida | 252/589 |
| 5,874,491 | 2/1999 | Anders | 523/457 |
| 5,905,128 | 5/1999 | Chen et al. | 526/279 |

FOREIGN PATENT DOCUMENTS

| | | |
|---|---|---|
| 0 165 340 A1 | 12/1985 | European Pat. Off. . |
| 0 579 835 A1 | 1/1994 | European Pat. Off. . |
| 8-222369 | 8/1996 | Japan . |
| 9-213478 | 8/1997 | Japan . |
| 9-245511 | 9/1997 | Japan . |

*Primary Examiner*—Georgia Epps
*Assistant Examiner*—Tim Thompson
*Attorney, Agent, or Firm*—Oblon, Spivak, McLelland, Maier & Neustadt, P.C.

[57] ABSTRACT

A color conversion material comprises a high-molecular material having a light transmittance of at least 90% in a visible light region, a fluorescent dye contained therein, and a fluorescent pigment particle dispersed therein. The wavelength of unconverted light incident on the color conversion material is up to 520 nm, the light emission maximum wavelength of the conversion material is at least 580 nm upon incident light conversion, and the conversion efficiency of at least 10% is obtained.

18 Claims, 1 Drawing Sheet

COLOR CONVERSION MATERIAL, AND ORGANIC ELECTROLUMINESCENT COLOR DISPLAY USING THE SAME

BACKGROUND OF THE INVENTION

The present invention relates to a display, and especially a color display, which comprises a fluorescent substance, and an organic electroluminescent light emitting device (which will hereinafter be often called an organic EL device for short) using an organic compound.

An organic EL device comprises a cathode and an anode with a fluorescent organic compound-containing thin film sandwiched between them. Upon electrons and holes injected into the thin film and recombined therein, excitons are generated. Upon deactivation of the excitons, the device emits light (fluorescence, and phosphorescence).

Such an organic EL device attracts attentions because they can achieve surface emission at a very high luminance ranging from a few hundred $cd/m^2$ to 10,000 $cd/m^2$ with a low driving voltage of the order of 10 volts.

A display constructed using such an organic EL device may potentially have various applications, and its application to color displays in particular is an important subject. For instance, a light emitting device may be applied to a color display in the following three ways. One possible approach uses a specific light emitting material for each of red, green, and blue pixels. One typical embodiment of this approach is known as set forth in SID 96 DIGEST. 185 14.2: Novel Transparent Organic Electroluminescent Devices G. Gu, V. Bulovic, P. E. Burrows, S. R. Forrest, M. E. Tompson. However, the color light emitting device (heterostructure organic light emitting device) described therein has a multilayer structure comprising light emitting layers (Red ETL, Green ETL, and Blue ETL) corresponding to R, G and B, respectively. If pixels are arranged in matrix array, then there is a limit to the mask used for pattern formation. This is because the organic EL device in film form is formed by a vacuum evaporation process. Further, the organic EL material is soluble in an organic solvent; difficulty is involved in photolithographic pattern formation. For this reason, there is a problem that no high precision display device is achieved.

Another possible approach employs an organic EL material emitting white light in combination with a color filter, thereby obtaining red, green, and blue light emissions. Never until now, however, is any organic EL material emitting white light by itself with high light emission efficiency known. White light may be obtained by allowing organic EL materials corresponding to red, green, and blue to give out light. However, this requires a complicated arrangement, and is not a technically realistic option. Here consider a supposed case where organic EL materials corresponding to red, green, and blue are allowed to emit light. Since the materials differ from each other in terms of light emission luminance and service life, the overall initial luminance is limited to that of the material having the lowest luminance. Also, these materials undergo color tone changes with time and make device design difficult, and so are not practical.

Yet another possible approach relies upon a specific organic EL material giving out blue light which is in turn converted to green light and red light through a color conversion layer comprising a fluorescent material. Making use of a single blue organic EL device alone, this approach is favorable because not only structural simplification but also cost reductions are achievable. Besides, if the color conversion layer is formed in a pattern-wise manner, images are then produced in full color. As typically referred to in JP-A 3-152897, however, a fluorescent material that can convert blue directly to red with high efficiency is virtually unheard-of because of unavailability of a fluorescent material showing a large Stokes' shift, such as one having a high absorption coefficient with respect to blue and a high fluorescence yield with respect to red. In view of the molecular orbit of an organic molecule, too, it is difficult to obtain a substance having such nature. Thus, a problem with this approach is that no high luminance display can be obtained because the overall light emission luminance should be regulated in conformity with red light of a low light emission luminance.

The conversion of blue light to red light may possibly be achieved by use of a simple mixture of a fluorescent material that absorbs blue light and gives out green light with a fluorescent material that absorbs green light and gives out red light. However, a color conversion material obtained by the simple mixing of fluorescent materials can not actually be used because fluorescence emission efficiency drops considerably due to interaction between the fluorescent materials.

SUMMARY OF THE INVENTION

One object of the present invention is therefore to provide a color conversion material that enables blue light to be converted directly to red light with high efficiency.

Another object of the present invention is to provide an organic EL color display of simple construction yet high efficiency and high resolution, which can emit different colors of light without recourse to a plurality of organic EL light emitting materials.

Such objects are accomplished by the inventions defined below as (1) to (8).

(1) A color conversion material comprising a high-molecular material having a light transmittance of at least 90% in a visible light region, a fluorescent dye contained therein, and a fluorescent pigment particle dispersed therein, wherein:

a wavelength of unconverted light incident on said color conversion material is up to 520 nm, a light emission maximum wavelength of said color conversion material is at least 580 nm upon incident light conversion, and a conversion efficiency of at least 10% is achieved.

(2) The color conversion material according to (1), wherein a wavelength of fluorescence from said fluorescent pigment particle is shorter than a wavelength of fluorescence from said fluorescent dye.

(3) The color conversion material according to (1), wherein a wavelength of fluorescence from said fluorescent dye is shorter than a wavelength of fluorescence from said fluorescent pigment particle.

(4) The color conversion material according to any one of (1) to (3), wherein a volume content of said fluorescent pigment particle is 1 to 80% by volume.

(5) The color conversion material according to any one of (1) to (4), wherein said high-molecular material contains said fluorescent dye at a concentration of 0.001 to 30% by weight.

(6) The color conversion material according to any one of (1) to (5), which contains two or more fluorescent pigments and/or fluorescent dyes.

(7) The color conversion material according to any one of (1) to (6), which is provided in pattern form by means of screen printing, or photolithography.

(8) An organic EL color display comprising an organic EL device having a light emission maximum wavelength of up to 520 nm, a color conversion material as recited in any one of (1) to (7), and color filters for red, green, and blue.

BRIEF DESCRIPTION OF THE DRAWINGS

The above and other objects, features, and advantages of the present invention will be better understood from the following description in conjunction with the accompanying drawings, in which.

DETAILED EXPLANATION OF THE INVENTION

Figure 1:
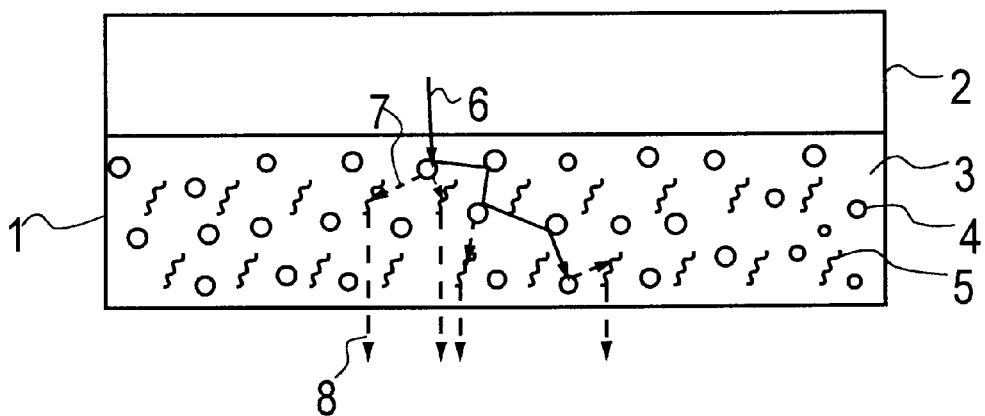
FIG. 1 is a schematic view of one embodiment of the light conversion material according to the present invention.

Some preferred embodiments of the present invention will now be explained more specifically.

The color conversion material of the present invention comprises a high-molecular material that has a light transmittance of at least 90% in the visible light region as a binder. Slightly soluble fluorescent pigment particles that are substantially insoluble in an organic solvent and incompatible with the high-molecular material are dispersed in the binder while a fluorescent dye that is soluble in the organic solvent and compatible with the high-molecular material is dissolved in the binder. The wavelength of unconverted light incident on the color conversion material is up to 520 nm, the light emission maximum wavelength of the conversion material upon incident light conversion is at least 580 nm, and the conversion efficiency is at least 10%.

In the color conversion material of the present invention, the fluorescent pigment particles are thus allowed to coexist with the fluorescent dye. In a solid phase the two fluorescent materials are separated from each other so that interaction between them does not substantially occur. This ensures efficient conversion of the fluorescent material that absorbs blue light and gives out green light and the fluorescent material that absorbs green light and gives out red light, whereby blue light is convertible directly to red light with high efficiency throughout the color conversion material.

For the fluorescent pigment particles it is basically preferable to use those having a high fluorescent quantum efficiency, and especially those having strong absorption in the EL light emission wavelength region. The fluorescent pigment particles used may be either those absorbing blue light and giving out green light or those absorbing green light and giving out red light. In the former case, the dye used in combination with the pigment particles absorbs green light and gives out red light, and in the latter case, the dye used in combination with the pigment particles absorbs blue light and gives out green light.

More specifically, when the absorption maximum wavelength is blue absorption, the maximum wavelength of 400 to 520 nm, and especially 430 to 480 nm is preferred with a half-width of the order of 100 to 200 nm. Preferably in this case, the light emission maximum wavelength $\lambda$max of fluorescent spectra is in the range of 500 to 560 nm with a half-width of usually up to 200 nm, and especially about 100 nm. On the other hand, when the absorption maximum wavelength is green absorption, the maximum wavelength of 500 to 620 nm, and especially 530 to 580 nm is preferred with a half-width of the order of 100 to 200 nm. Preferably in this case, the light emission maximum wavelength $\lambda$max of fluorescent spectra is in the range of 580 to 640 nm with a half-width of usually up to 200 nm, and especially about 100 nm. It is here preferable to make an appropriate selection from these wavelength regions in such a manner that the fluorescent materials, or the dye and pigment to be combined, have a suitable Stokes' shift.

Practically, the fluorescent pigment is generally broken down into two types, a pigment dye type and a synthetic resin solid solution type. Included in the pigment dye type, for instance, are azo, phthalocyanine, anthraquinone, quinacridone, isoindolinone, thioindigo, perylene, and dioxazine pigment dyes, from which an appropriate selection may be made. In particular, the azo or isoindolinone pigment, or Lumogen Color (made by BASF) is preferred. The synthetic resin solid solution type is obtained in fine powder form by dissolving the fluorescent dye to be described later in a resin selected from the group consisting of urea, melamine, benzoguanamine, acrylic, vinyl chloride, alkyd, allylsulfone, phenol and like other resins, followed by curing, and pulverization.

Such a pigment is preferably dispersed in the high-molecular material (binder) and coating organic solvent to be described later, and should be slightly soluble in the high-molecular material and organic solvent, accordingly. The proportion of the high-molecular material and organic solvent occupied by the pigment is 1 to 80% by volume, preferably 10 to 60% by volume, and especially about 20 to 40% by volume. Although not critical, the particle diameter of the pigment is preferably smaller than the thickness of the light conversion layer to be formed, and so is especially 100 to 10,000 nm, and more especially about 500 to 2,000 nm.

Specifically, laser dyes are suitable for the fluorescent dye soluble in the organic solvent and high-molecular material. More specifically, preference is given to xanthene dyes such as Rhodamine B, and Rhodamine 6G; cyanine dyes such as 4-dicyanomethylene-2-methyl-6-(p-dimethylaminostyryl)-4H-pyran (DCM); pyridine dyes such as 1-ethyl-2-(4-p-dimethylaminophenyl)-1,3-butadienyl)pyridinium-perchlorate (Pyridine 1); oxazine dyes; chrysene dyes; thioflavine dyes; perylene dyes; pyrene dyes; anthracene dyes; acridone dyes; acridine dyes; fluorene dyes; terphenyl dyes; ethene dyes; butadiene dyes; hexatriene dyes; oxazole dyes; coumarin dyes; stilbene dyes; di- and tri-phenylmethane dyes; thiazole dyes; thiazine dyes; naphthalimide dyes; and anthraquinone dyes, among which the xanthene dyes such as Rhodamine B, and Rhodamine 6G, and the coumarin or naphthalimide dyes are most preferred.

This dye is soluble in the high-molecular material and organic solvent to be described later, and is preferably present in the high-molecular material at a concentration of 0.01 to 30% by weight, especially 0.1 to 10% by weight, and more especially 0.5 to 5% by weight, although depending on what type of pigment is used in combination therewith.

For the binder, it is basically preferable to make a selection from materials that do not extinguish fluorescence, and especially materials that can be finely patterned by screen printing, photolithography or the like. It is also preferred that the binder should not be damaged during ITO film formation. Examples of the binder are polystyrene, polyacrylic or polymethacrylic ester, polyvinyl acetate, polyvinyl chloride, polyvinyl butyral and its derivatives, polyester resin, acrylic resin, epoxy resin, silicone resin, and polyimide resin. Particular preference is then given to photosensitive or non-photosensitive polyimide, and acrylic resins. Such a binder should preferably has a light transmittance of at least 90%, and especially at least 95% in the visible light region.

The organic solvent used herein may be selected from known suitable organic solvents depending on the binder used, and the fluorescent dye to be dissolved therein. For instance, use may be made of hydrocarbon solvents such as toluene, xylene, aliphatic mixed solvents, aliphatic/aromatic mixed solvents, and aromatic mixed solvents; alcohol solvents such as methanol, ethanol, isopropanol, n-butanol, isobutanol, and cyclohexanol; ester solvents such as ethyl acetate, butyl acetate, isobutyl acetate, and cyclohexyl acetate; ketone solvents such as acetone, methyl ethyl ketone, methyl isobutyl ketone, cyclohexanone, di-isobutyl ketone, isophorone, and diacetone alcohol; and ether-alcohol solvents such as methyl cellosolve acetate, cellosolve acetate, and carbitol acetate.

The light conversion material is obtained by dissolving the binder and fluorescent dye in the organic solvent, and dispersing the fluorescent pigment therein. When such a light conversion material is used with a display, etc., it may be used in a thin film form of fluorescence conversion layer, which is located in the vicinity of a light emitting layer, etc., (just beneath a light emitting layer 2 in the embodiment of FIG. 1). The fluorescence conversion layer may be provided by means of printing or coating. More specifically, screen printing or the like is preferred for printing, and coating processes are preferred for coating. The coating processes used herein include a bar coating process, roll coating processes such as a gravure or reverse coating process, a doctor or air knife process, a nozzle coating process, and a spin coating process, all known in the art. For pattern formation, photolithography is used in combination with the coating process.

A preferred embodiment of the light conversion material of the present invention is shown in FIG. 1. FIG. 1 is a schematic view of one embodiment of the display constructed with the light conversion material of the present invention.

As can be seen from FIG. 1, a light conversion layer 1 made up of the light conversion material according to the present invention comprises in a binder 3 a fluorescent pigment particle 4 and a fluorescent dye 5 (which is actually dissolved in the binder although visibly shown). Adjacent to the light conversion layer 1 (on the light conversion layer 1 in FIG. 1) there is located a blue light emitting layer 2 such as an organic EL device.

Upon striking on the fluorescent pigment particle 4 in the light conversion layer 1, a part of blue light 6 from the light emitting layer 2 excites the phosphor in the fluorescent pigment particle 4, giving out green fluorescence 7. This green fluorescence 7 is absorbed in the fluorescent dye 5 dissolved uniformly throughout the light conversion layer 1, whereby the phosphor in the fluorescent dye is excited to give out red fluorescence 8. In this way, the blue light 6 from the light emitting layer 2 is successively converted to the red fluorescence 8. On the other hand, a portion of the blue light 6 not absorbed in, and reflected at, the fluorescent pigment particle 4 strikes on another fluorescence pigment particle 4, in which it is partially absorbed. Thus, an optical path taken by the blue light 6, which the light emitting layer 2 gives out, becomes substantially long, resulting in an efficiency improvement. Also, some portion of the blue light 6 is absorbed directly in the fluorescent dye 5 to give out red fluorescence 8.

When the light conversion material of the present invention is used with a color display, it is preferable to use color filters in combination with blue, green, and red transmitting layers. For the color filters, use may be made of those used on liquid crystal displays, etc. However, it is preferable to control the characteristics of color filters in conformity with light emitted by the organic EL device, so that the efficiency of light extraction, and color purity can be optimized. It is also preferable to use color filters capable of cutting off light of short wavelengths absorbed by an EL device material or a fluorescence conversion layer, thereby improving the light resistance of the device and the contrast of displays presented. The light cut off in this case is light having wavelength of at least 560 nm and light having wavelength of up to 480 nm for green, light having wavelength of at least 490 nm for blue, and light having wavelength of up to 580 nm for red. By use of such color filters, it is preferable to regulate the respective layers in conformity with chromaticity coordinates according to the NTSC standard or the current CRT standard. Such chromaticity coordinates may be determined by use of general chromaticity coordinates measuring equipment, for instance, BM-7 or SR-1 (made by Topcon Co., Ltd.). Each color filter may have a thickness of about 0.5 to 20 $\mu$m.

Alternatively, it is acceptable to use optical thin films such as dielectric multilayer films in place of the color filters.

Preferably, the light conversion material of the present invention is used in combination with an organic EL device to construct a high-efficiency color display.

Figure 2:
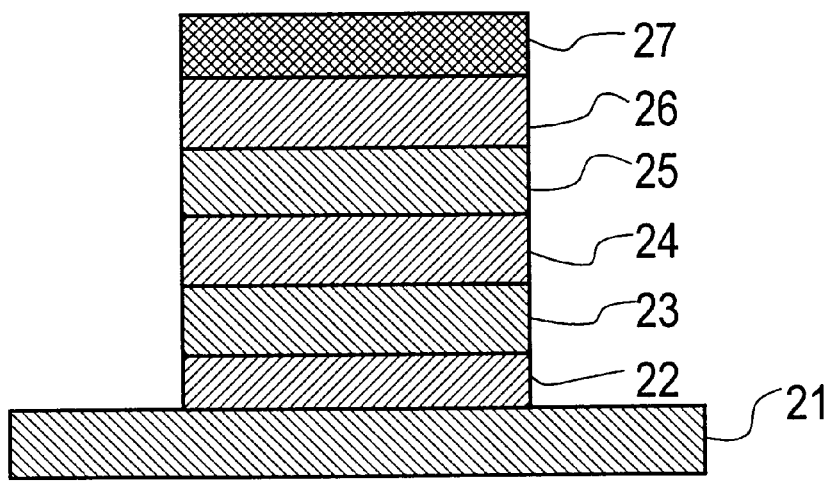
FIG. 2 is a schematic view of one embodiment of the organic EL light emitting device according to the present invention.

One embodiment of such an organic EL light emitting device is shown in FIG. 2. The organic EL light emitting device shown in FIG. 2 comprises, in order from a light conversion layer (not shown), an anode 22, a hole injecting layer 23, a hole transporting layer 24, a light emitting layer 25, an electron injecting and transporting layer 26, and a cathode 27.

The EL device of the invention is never limited to the illustrated embodiment, and so may have various structures. For instance, the electron injecting and transporting layer may be dispensed with or made integral with the light emitting layer, or alternatively the hole injecting, and transporting layers may be formed as one integral piece or as a combined hole injecting and transporting layer.

The cathode may be formed by evaporation or sputtering. Such organic layers as represented by the light emitting layer may be formed by vacuum evaporation or the like, and the anode may be constructed as mentioned above. If necessary, these layers may be patterned, for example, by mask evaporation or film formation followed by etching whereby a desired light emitting pattern is accomplished. If the substrate bears a thin film transistor (TFT), the respective layers may be formed in accordance with the pattern of TFT to accomplish a display or drive pattern immediately. Finally, a protective layer is formed over the device using inorganic materials such as SiOx and organic materials such as Teflon.

To achieve effective electron injection, the cathode is preferably made up of a material having a low work function, for instance, any one of metal elements such as K, Li, Na, Mg, La, Ce, Ca, Sr, Ba, Al, Ag, In, Sn, Zn, and Zr. To improve the stability of the cathode, it is preferably made up of a binary or ternary alloy system comprising two or three of the aforesaid metal elements. Preferable for such an alloy system, for instance, are Ag.Mg (Ag: 1 to 20 at %), Al.Li (Li: 1 to 20 at %), In.Mg (Mg: 50 to 80 at %), and Al.Ca (Ca: 5 to 20 at %).

The cathode thin film may have at least a thickness large enough to achieve satisfactory electron injection, for instance, of at least 50 nm, and preferably at least 100 nm. While there is no upper limit to film thickness, a film thickness of about 100 to 500 nm is usually preferred.

The protective layer may be either transparent or opaque. To make the protective layer transparent, it is preferable to make a selection from transparent materials (e.g., $SiO_2$, and SIALON), or alternatively perform thickness control (in such a manner that at least 80% of emitted light can transmit through the protective layer). In general, the protective layer may have a thickness of about 50 to 1,200 nm. Although no particular limitation is placed on how to form the protective layer, that is, the protective layer may be formed as by evaporation, it is preferable to make use of sputtering which enables the protective layer to be formed subsequently to the formation of the cathode.

Here the organic layers provided in the EL device of the present invention are explained.

The light emitting layer has functions of injecting holes and electrons, transporting them, and recombining holes and electrons to create excitons. For the light emitting layer, it is preferable to use a compound that is stable to both electron and hole carriers, and is of strong fluorescence intensity.

The hole injecting layer, which is sometimes referred to as a charge injecting layer, has a function of facilitating injection of holes from the anode, and the hole transporting layer, which is often called a charge transporting layer, has functions of transporting holes, and blocking electron transportation.

For example, when the compound used in the light emitting layer has a relatively low electron injecting and transporting function, an electron injecting and transporting layer having functions of facilitating injection of electrons from the cathode, transporting electrons, and blocking hole transportation may be provided.

The hole injecting layer, hole transporting layer, and electron injecting and transporting layer are effective for increasing the number of holes and electrons injected into the light emitting layer and confining holes and electrons therein for optimizing the recombination region to improve light emission efficiency.

The electron injecting and transporting layer may be constructed in the form of a double-layered structure consisting separately of a layer having an injecting function and a layer having a transporting function.

The thickness of the light emitting layer, the total thickness of the hole injecting and transporting layers, and the thickness of the electron injecting and transporting layer are not critical to the practice of the present invention, and so vary with their particular formation techniques. However, a thickness of about 5 to 100 nm is usually preferable.

The thicknesses of the hole injecting and transporting layers, and the electron injecting and transporting layer are equal to, or ranges from about 1/10 times to about 10 times, the thickness of the light emitting layer although it depends on the design of the recombination/light emitting region. When the electron or hole injecting and transporting layer is separated into an injecting layer and a transporting layer, it is preferable that the injecting layer is at least 1 nm thick and the transporting layer is at least 20 nm thick. The upper limit to thickness is usually about 100 nm for the injecting layer and about 100 nm for the transporting layer. The same film thickness applies when two injecting and transporting layers are provided.

By controlling the layer thickness while taking into account the carrier mobility and carrier density (depending on ionization potential and electron affinity) of the light emitting layer, the electron injecting and transporting layer, and the hole injecting and transporting layer to be combined, the free design of the recombination/light emitting region, the design of emission color, the control of the luminance and spectrum of light emission by the interference of both the electrodes, and the control of the spatial distribution of light emission become feasible.

In the organic EL device according to the present invention, the light emitting layer contains a bluish fluorescent material that is a compound capable of emitting light. The fluorescent material used herein, for instance, may be selected from bluish light emitting materials such as those disclosed in JP-A's 6-110569 (phenylanthracene derivatives) and 6-114456 (tetraarylethene derivatives). Additionally, quinacridone, coumarin, rubrene, and styryl dyes, tetraphenylbutadiene, anthracene, perylene, coronene, and 12-phthaloperinone derivatives may be used. In the practice of the invention, a selection may be made from the aforesaid materials emitting blue light. The light emitting layer may also serve as an electron injecting and transporting layer. These fluorescent materials may be evaporated or otherwise deposited.

For the electron injecting and transporting layer which is provided if necessary, there may be used organic aluminum or metal complexes such as tris(8-quinolinolato)aluminum, oxadiazole derivatives, perylene derivatives, pyridine derivatives, pyrimidine derivatives, quinoline derivatives, quinoxaline derivative, diphenylquinone derivatives, and nitro-substituted fluorene derivatives. The electron injecting and transporting layer may also serve as a light emitting layer as previously mentioned. Like the light emitting layer, the electron injecting and transporting layer may be formed by evaporation or the like.

Where the electron injecting and transporting layer is a double-layered structure comprising an electron injecting layer and an electron transporting layer, two or more compounds are selected in a proper combination from the compounds commonly used for electron injecting and transporting layers. In this regard, it is preferred to laminate layers in such an order that a compound layer having a greater electron affinity is disposed contiguous to the cathode. This order of lamination also applies where a plurality of electron injecting and transporting layers are provided.

For the hole injecting and transporting layers, use may be made of various organic compounds as disclosed in JP-A's 63-295695, 2-191694, 3-792, 5-234681, 5-239455, 5-299174, 7-126225, 7-126226, and 8-100172 as well as EP 0650955A1. Examples are tetraarylbenzidine compounds (triaryldiamine or tetraphenyldiamine (TPD)), aromatic tertiary amines, hydrazone derivatives, carbazole derivatives, triazole derivatives, imidazole derivatives, oxadiazole derivatives having an amino group, and polythiophenes. Where these compounds are used in combination of two or more, they may be stacked as separate layers, or otherwise mixed.

For the hole injecting and transporting layers, compounds are selected in a proper combination from the compounds mentioned above. In this regard, it is preferred to laminate layers in such an order that a compound layer having a lower ionization potential is disposed contiguous to the anode (ITO, etc.). It is also preferred to use a compound having good thin film forming ability at the anode surface. This order of lamination holds for the provision of two or more hole injecting and transporting layers, and is effective as well for lowering driving voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by re-absorption even if a compound having a low ionization potential and absorption in the visible range is used in the hole injecting layer.

Like the light emitting layer and so on, the hole injecting and transporting layers may be formed by evaporating the aforesaid compounds.

For the transparent electrode used as the anode in the practice of the invention, the type and thickness of an anode-forming material are preferably determined such that at least 80% of emitted light transmits therethrough. For example, tin-doped indium oxide (ITO), zinc-doped indium oxide (IZO), $SnO_2$, and polypyrrole doped with a dopant may be used as the anode. The anode has preferably a thickness of about 10 to 500 nm. The driving voltage should preferably be low enough to improve the reliability of the device.

For the substrate material, transparent or translucent materials such as glass, quartz and resins are used when emitted light is taken out of the substrate side.

The organic EL light emitting device used in the present invention is generally of the DC drive type while it may be of the AC or pulse drive type. The applied voltage is generally about 2 to 20 volts.

EXAMPLE

The present invention are explained more specifically with reference to some examples, and comparative examples.

Example 1

Preparation of Light Conversion Material 1

Synleuhi Color FA45J (made by Synleuhi Co., Ltd.), and Rhodamine B (made by Kodak) were used as a fluorescent pigment for absorption of blue light, and a fluorescent dye for absorption of green light, respectively. A negative type acrylic photoresist CT (made by Fuji Hanto Electronics Technology Co., Ltd., and having a light transmittance of 98%/cm$^3$ in the visible light region) was used as a binder. The binder, along with the fluorescent dye, was dissolved in an organic solvent (ethanol), and the pigment was added to the solution, followed by a 10-minute agitation and dispersion in a homogenizer. The obtained light conversion material was spin coated at a thickness of 10 μm to make a light conversion layer.

This light conversion layer had an absorption maximum wavelength of 460 nm with a half-width of 50 nm, and the maximum wavelength of emitted red fluorescence was 590 nm with a half-width of 50 nm. The efficiency of conversion of 460 nm blue to 590 nm red was 18%.

Example 2
Preparation 2 of Light Conversion Material

A color conversion material was prepared as in Example 1 with the exception that Synleuhi Color FZ5005 was used as the fluorescent pigment for absorption of blue light in place of Synleuhi Color FA45J. Consequently, substantially similar results as in Ex. 1 were obtained. In this connection, the efficiency of conversion of 460 nm blue to 590 nm red was 15%.

Example 3
Preparation 3 of Light Conversion Material

A color conversion material was prepared as in Example 1 with the exception that Rhodamine 6G was used as the fluorescent dye for absorption of green light in place of Rhodamine B. Consequently, substantially similar results as in Ex. 1 were obtained. In this connection, the efficiency of conversion of 460 nm blue to 590 nm red was 13%.

Comparative Example 1
Preparation 4 of Light Conversion Material

A color conversion material was prepared as in Example 1 with the exception that only the fluorescent dye for absorption of green light, Rhodamine B, was used; the fluorescent pigment for absorption of blue light, Synleuhi FA45J, was not used. Consequently, the efficiency of conversion of 460 nm blue to 590 nm red was reduced to an extremely low level of 2% or lower.

Comparative Example 2
Preparation 5 of Light Conversion Material

A color conversion material was prepared as in Example 1 with the exception that Coumarin 6 (made by Kodak) was used as the fluorescent dye for absorption of blue light in place of the fluorescent pigment for absorption of blue light, Synleuhi FA45J. Consequently, extinction due to interaction between Coumarin 6 and Rhodamine B was found; 590 nm light (converted light) was not obtained.

Preparation of Organic El Device

An ITO transparent anode was formed at a thickness of 100 nm on a glass substrate at a rate of 10 nm/min., following by patterning.

The target used was $In_2O_3$ having $SnO_2$ (10 mol %) incorporated therein, the sputtering gas used was Ar, and the gas pressure applied was 1 Pa. The temperature and power applied were 80° C. and 1 W/cm$^2$, respectively, with a spacing of 8 cm between the substrate and the target.

The anode was ultrasonically washed with neutral detergent, acetone, and ethanol, and then pulled up from boiling ethanol, followed by drying. The semi-transparent anode was cleaned on its surface with $UV/O_3$. Subsequently, the anode was fixed to a substrate holder in a vacuum evaporation apparatus, which was evacuated to a vacuum of $1\times10^{-4}$ Pa or lower.

With the vacuum kept, MTDATA having the following formula I was evaporated at a deposition rate of 0.2 nm/sec. to a thickness of 50 nm to form a hole injecting layer.

Formula I

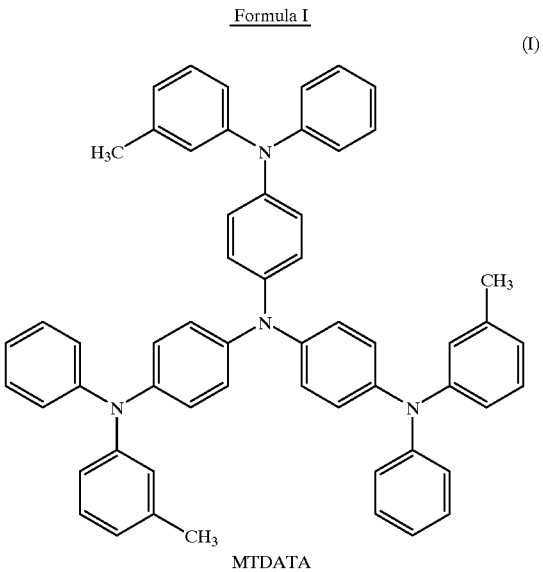

MTDATA

With the vacuum still kept, N,N,N',N'-tetra-m-biphenyl-tolyl-4,4'-diamino-1,1'-biphenyl (TPD) having the following formula II was evaporated at a deposition rate of 0.2 nm/sec. to a thickness of 20 nm to form a hole transporting layer.

Formula II

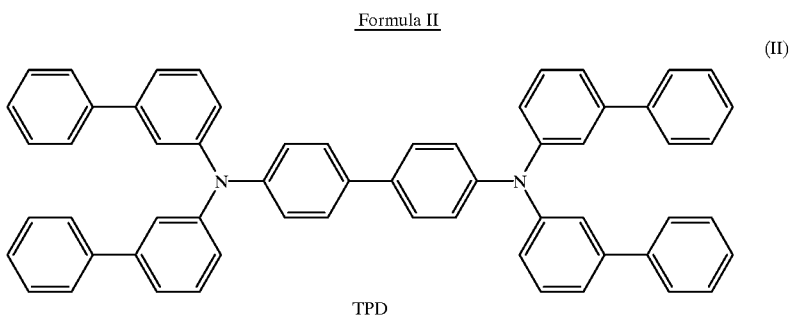

TPD

With the vacuum still kept, DPA having the following formula III was evaporated at a deposition rate of 0.2 nm/sec. to a thickness of 20 nm to form a light emitting layer.

Formula III

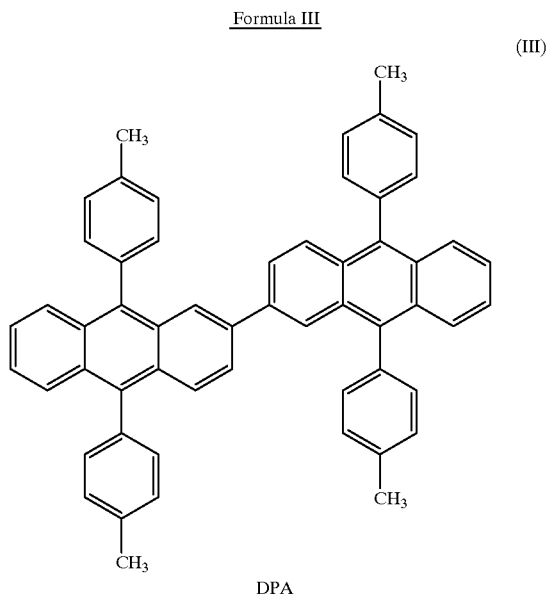

DPA

With the vacuum still kept, DQX having the following formula IV was evaporated at a deposition rate of 0.2 nm/sec. to a thickness of 20 nm to form an electron injecting and transporting layer.

Formula IV

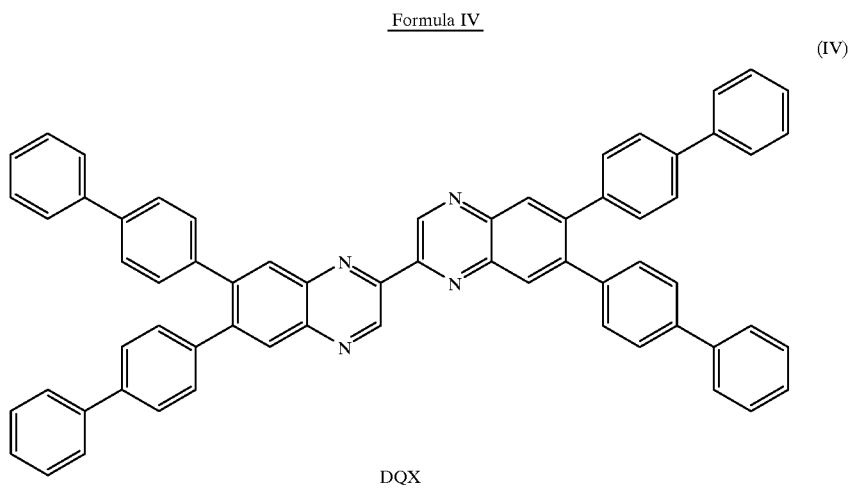

DQX

Then, the substrate was transferred from the vacuum evaporation apparatus to a sputtering apparatus wherein an Ag.Mg target was used to form a cathode thereon at a rate of 10 nm/min. to a thickness of 230 nm by means of DC sputtering. The sputtering gas, gas pressure, and power applied were Ar, 1 Pa, and 100 W, respectively, with a spacing of 8 cm between the substrate and the target.

Finally, aluminum was sputtered to a thickness of 200 nm to form a protective layer, thereby obtaining an organic thin film light emitting device (organic EL device).

A DC voltage was applied across the organic thin film light emitting device to continuously drive the device at a constant current density of 10 mA/cm$^2$. In the initial stage, the device when driven at 8.5 volts was found to emit blue light at a luminance of 450 cd/m$^2$ (light emission maximum wavelength λmax=460 nm).

Preparation of Organic EL Display

A color display was prepared using the aforesaid organic EL device as a device, utilizing the aforesaid light conversion material upon patterned, and employing as blue, green, and red transmitting layers color filters (made by Fuji Hanto Co., Ltd.), one cutting off light having wavelength of at least 560 nm and light having wavelength of up to 480 nm for green, one cutting off light having wavelength of at least 490 nm for blue, and one cutting off light having wavelength of up to 580 nm for red.

The organic EL light emitting device of the thus fabricated display was driven as mentioned above. Consequently, the blue light emitting portion gave off blue light at a luminance of 171 cd/m$^2$ with chromaticity coordinates of x=0.13 and y=0.10, the green light emitting portion gave off green light at a luminance of 310 cd/m$^2$ with chromaticity coordinates of x=0.33 and y=0.61, and the red light emitting portion gave off red light at a luminance of 75 cd/m$^2$ with chromaticity coordinates of x=0.61 and y=0.33.

According to the present invention, it is possible to provide a color conversion material enabling blue light to be converted directly to red light with high efficiency, and an organic EL color display of simple construction yet high efficiency and high resolution, which enables different colors of light to be emitted without recourse to a plurality of organic EL light emitting materials.

Japanese Patent Application No. 166627/1987 is herein incorporated by reference.

Although some preferred embodiments have been described, many modifications and variations may be made thereto in the light of the above teachings. It is therefore to be understood that within the scope of the appended claims, the invention may be practiced otherwise than as specifically described.

What is claimed is:
1. A color conversion material comprising
   a binder including at least one high-molecular weight material and having a light transmittance of at least 90% in a visible light region,
   at least one fluorescent dye contained in said binder, and
   particles of at least one fluorescent pigment dispersed in said binder, wherein said color conversion material converts at least 10% of incident visible light having a wavelength of no more than 520 nm to light having a light emission maximum wavelength of at least 580 nm.

2. The color conversion material according to claim 1, wherein a wavelength of fluorescence from said particles of at least one fluorescent pigment is shorter than a wavelength of fluorescence from said at least one fluorescent dye.

3. The color conversion material according to claim 1, wherein a wavelength of fluorescence from said at least one fluorescent dye is shorter than a wavelength of fluorescence from said particles of at least one fluorescent pigment.

4. The color conversion material according to claim 1, wherein said particles of at least one fluorescent pigment form 1 to 80% by volume of said color conversion material.

5. The color conversion material according to claim 1, wherein said binder contains said at least one fluorescent dye at a concentration of 0.001 to 30% by weight.

6. The color conversion material according to claim 1, wherein said particles of at least one fluorescent pigment comprise two or more fluorescent pigments.

7. The color conversion material according to claim 1, wherein the color conversion material is provided in pattern form by means of screen printing or photolithography.

8. An organic electroluminescent color display comprising an organic electroluminescent device having a light emission maximum wavelength of no more than 520 nm, the color conversion material of claim 1, and color filters for red, green, and blue.

9. The color conversion material according to claim 1, wherein said at least one fluorescent dye comprises two or more fluorescent dyes.

10. The color conversion material according to claim 1, wherein the high-molecular weight material in the binder is selected from the group consisting of polystyrene, polyacrylic ester, polymethacrylic ester, polyvinyl acetate, polyvinyl chloride, polyvinyl butyral, polyester resin, acrylic resin, epoxy resin, silicone resin and polyimide resin.

11. A color conversion material comprising a binder including at least one high-molecular weight material and having a light transmittance of at least 90% in a visible light region, at least one fluorescent dye contained in the binder, and particles of at least one fluorescent pigment dispersed in the binder, wherein either the at least one fluorescent dye absorbs visible light having a wavelength of no more than 520 nm and emits a first fluorescent light having a light emission maximum wavelength of 500 to 560 nm, and the particles of at least one fluorescent pigment absorb the first fluorescent light and emit a second fluorescent light having a light emission maximum wavelength of 580 to 640 nm; or the particles of at least one fluorescent pigment absorb visible light having a wavelength of no more than 520 nm and emit a first fluorescent light having a light emission maximum wavelength of 500 to 560 nm, and the at least one fluorescent dye absorbs the first fluorescent light and emits a second fluorescent light having a light emission maximum wavelength of 580 to 640 nm.

12. The color conversion material according to claim 11, wherein the high-molecular weight material in the binder is selected from the group consisting of polystyrene, polyacrylic ester, polymethacrylic ester, polyvinyl acetate, polyvinyl chloride, polyvinyl butyral, polyester resin, acrylic resin, epoxy resin, silicone resin and polyimide resin.

13. A method of making a color conversion material, the method comprising dissolving at least one fluorescent dye in a binder, dispersing particles of at least one fluorescent pigment in the binder, and forming the color conversion material of claim 1.

14. A method of making a color conversion material, the method comprising dissolving at least one fluorescent dye in a binder, dispersing particles of at least one fluorescent pigment in the binder, and forming the color conversion material of claim 11.

15. A method of using a color conversion material, the method comprising patterning the color conversion material of claim 1 by means of screen printing or photolithography.

16. A method of using a color conversion material, the method comprising patterning the color conversion material of claim 11 by means of screen printing or photolithography.

17. A method of using a color conversion material, the method comprising constructing a color display including the color conversion material of claim 1.

18. A method of using a color conversion material, the method comprising constructing a color display including the color conversion material of claim 11.

* * * * *